US007548102B2

(12) United States Patent
Ramaraju et al.

(10) Patent No.: US 7,548,102 B2
(45) Date of Patent: Jun. 16, 2009

(54) DATA LATCH WITH MINIMAL SETUP TIME AND LAUNCH DELAY

(75) Inventors: Ravindraraj Ramaraju, Round Rock, TX (US); Ambica Ashok, Austin, TX (US); Cody B. Croxton, Austin, TX (US); Peter M. Ippolito, Austin, TX (US); Prashant U. Kenkare, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/457,668

(22) Filed: Jul. 14, 2006

(65) Prior Publication Data

US 2008/0012618 A1    Jan. 17, 2008

(51) Int. Cl.
*H03K 3/289* (2006.01)
(52) U.S. Cl. .................... 327/202; 327/210; 327/212; 326/95
(58) Field of Classification Search ......... 327/200–203, 327/208, 210–213; 326/93–98; 377/115–117
See application file for complete search history.

(56) References Cited

U.S. PATENT DOCUMENTS

| 5,892,373 | A | * | 4/1999 | Tupuri et al. | ................. | 326/97 |
| 5,973,529 | A | * | 10/1999 | Chappell et al. | ............ | 327/200 |
| 5,999,030 | A | * | 12/1999 | Inoue | ........................ | 327/202 |
| 6,064,246 | A | * | 5/2000 | Endo et al. | ................... | 327/202 |
| 6,509,772 | B1 | * | 1/2003 | Ye et al. | ...................... | 327/211 |
| 6,586,981 | B2 | * | 7/2003 | Shibuya | ....................... | 327/203 |
| 6,822,500 | B1 | * | 11/2004 | Warnock et al. | ............ | 327/295 |

OTHER PUBLICATIONS

V. G. Oklobdzija, "Clocking and Clocked Storage Elements in a Multi-Gigahertz Environment," IBM J. Res. & Dev. vol. 47, No. 5/6, Sep./Nov. 2003.
V. Stojanovic et al., "Comparative Analysis of Master-Slave Latches and Flip-Flops for High-Performance and Low-Power Systems," IEEE Journal of Solid-State Circuits, vol. 34, No. 4, Apr. 1999.

* cited by examiner

*Primary Examiner*—Lincoln Donovan
*Assistant Examiner*—Patrick O'Neill
(74) *Attorney, Agent, or Firm*—Hamilton & Terrile, LLP; Gary W. Hamilton (57) ABSTRACT

The present invention provides a latch circuit that is operable to generate a pulse from first and second clock signals to allow gates in a datapath to propagate data with minimal latency. The first clock signal is a version of the system clock and the second control signal is a time-shifted, inverted version of the system clock signal. Each of the individual latches in a datapath comprises data propagation logic. In one embodiment of the invention, the data propagation logic uses the first and second clock signals to generate an "implicit" pulse. In another embodiment of the invention, the data propagation logic uses the first and second clock signals to generate an "explicit" pulse. The implicit and explicit pulses are used to control the transmission gate of the latch to provide propagation of data through the latch with minimal latency.

8 Claims, 9 Drawing Sheets

DATA LATCH WITH MINIMAL SETUP TIME AND LAUNCH DELAY

BACKGROUND OF THE INVENTION

1. Field of the Invention

The present invention relates in general to the field of information processing, and more specifically to a system and method for efficiently transferring data using latches in a datapath.

2. Description of the Related Art

Latches are one of the most common digital circuits used in modern data processing devices. In multi-gigahertz processor designs, the setup and launch delay through latches have become a significant portion of the cycle time. The sum of the setup time and launch delay of the latch, if large, exacerbates the delay in the critical timing paths. An optimal latch design would have a minimum combined sum of setup time ($d_{in}$ to clock) and launch (clock to $d_{out}$).

Master-slave latches are commonly used to propagate data through various datapaths within a data processing system. Such latches typically use multiple clocks to enable the master and the slave portions of the latch to receive data inputs and to propagate the data within the data processing system. While the setup and hold time for master-slave latches has been acceptable in many prior art processors, they present design problems in processors with multi-gigahertz speeds.

An alternative to a master-slave latch is the pulse latch, which has a minimal setup and launch delay time and, therefore, is ideal for optimizing critical speed paths. The pulse latch, however, requires a controlled pulse clock and the pulse generation circuit is very sensitive to process variation, which can affect the robustness of the pulse latch.

Another problem with prior art pulse generation circuitry is that a single pulse generator is generally used to generate pulses for an entire datapath. A properly shaped pulse is produced initially. However, the RC network of the metal wire used to transmit the pulse acts as a low-pass filter that attenuates the pulse. As the pulse propagates across the latches in the datapath, the pulse degrades and, therefore, successive cells in the datapath receive a degraded pulse signal. By the time the pulse reaches the last data cell in the datapath, the signal may have degraded significantly.

It is possible to implement signal shaping solutions to solve the problem of pulse signal variability for a particular process. Therefore, the pulse degradation problem can be solved by remedial measures for a particular feature size of a specific process. The solution for one process and feature size, however, does not readily translate to other feature sizes.

In view of the foregoing, it is apparent that there is a need for an improved latch triggering circuit that provides reduced circuit complexity. Furthermore, there is a need for a system and method for providing accurate pulse shaping that can be scaled across various processes. More specifically, there is a need for a pulse latch topology that can be used in a path where minimal setup and launch delay is required. In addition, the conventional master-slave latch topology must be implemented in a path where data setup is significantly ahead of the clock and the hold time is critical.

Accordingly, a need exists for logic circuitry that minimizes the propagation time for data transferred by latches in a datapath. More particularly, there is a need for improved logic to minimize the setup time and launch delay through the latches that are becoming a significant portion of the cycle time in modern processors. There is also a need for an improved apparatus and method to overcome the problems in the art, such as outlined above. Further limitations and disadvantages of conventional processes and technologies will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description is considered in conjunction with the following drawings, in which:

FIG. 1b is a timing diagram of the clock signals for implementing the prior art master-slave latch shown in FIG. 1a;

FIG. 2b is a timing diagram of a prior art clock signal for implementing the positive edge triggered latch shown in FIG. 2a;

FIG. 3b is an illustration of a prior art RC model of the clock signal wire of the pulse generation circuitry for the datapath shown in FIG. 3a;

FIG. 4b is a schematic representation of the internal pulse generation circuitry for one of the prior art latches in the datapath shown in FIG. 4a;

FIG. 5b is an illustration of the timing of clock signals generated using the clock regeneration circuitry show in FIG. 5a;

FIG. 6b is an illustration of an embodiment of the timing of clock signals used to generate an implicit pulse data propagation window for the edge triggered latch shown in FIG. 6a;

FIG. 6c is an illustration of an alternate embodiment of the timing of clock signals used to generate an implicit pulse data propagation window for the edge triggered latch shown in FIG. 6a;

FIG. 7b is an illustration of an embodiment of the timing of clock signals used to generate an explicit pulse data propagation window for the edge triggered latch shown in FIG. 7a;

FIG. 7c is an illustration of an alternate embodiment of the timing of clock signals used to generate an explicit pulse data propagation window for the edge triggered latch shown in FIG. 7a.

Where considered appropriate, reference numerals have been repeated among the drawings to represent corresponding or analogous elements.

DETAILED DESCRIPTION

Embodiments of logic circuitry are described for generating and utilizing a plurality of clock signals to minimize the propagation time for data transferred by latches in a datapath. The disclosed circuitry can be used to minimize the setup time and launch delay through the latches that are becoming a significant portion of the cycle time in modern processors. Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified drawings in order to avoid limiting or obscuring the present invention. Such descriptions and representations are used by those skilled in the art to describe and convey the substance of their work to others skilled in the art. Various illustrative embodiments of the present invention will now be described in detail with reference to the figures.

Figure 1A:
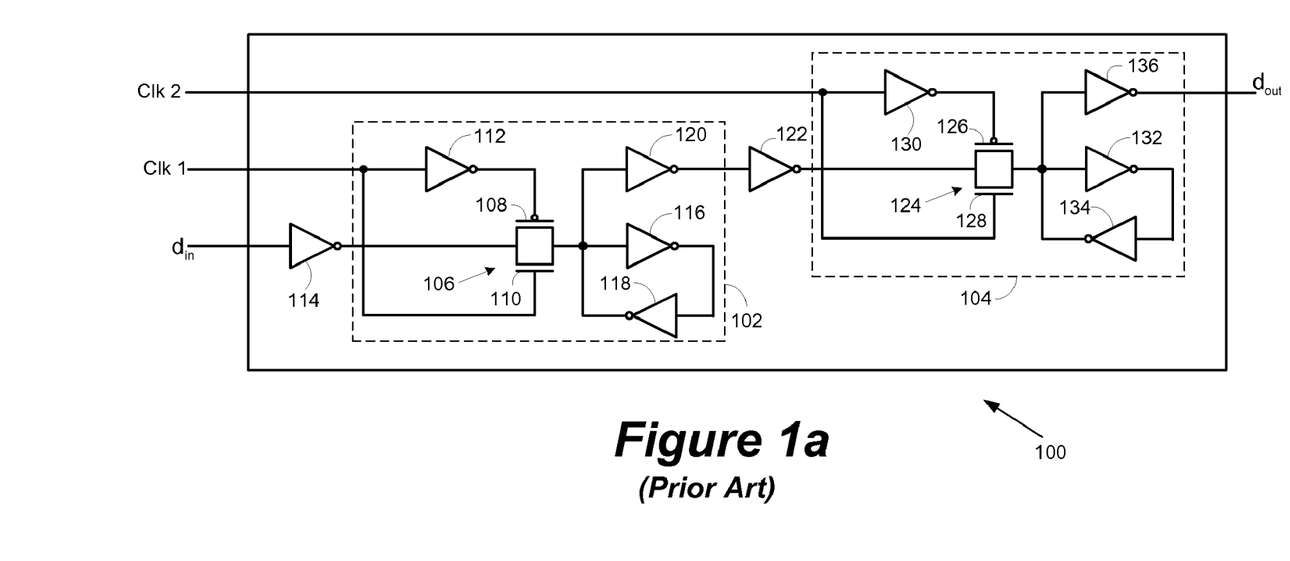
FIG. 1a is a schematic of logic components of a prior art master-slave latch.
Figure 1B:
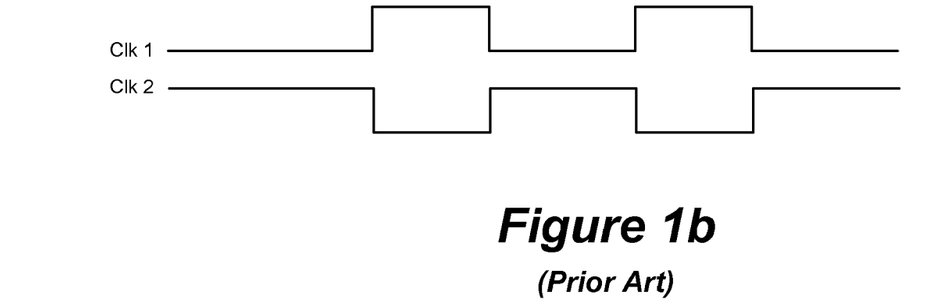

FIG. 1a is a schematic illustration of the logic components of a master-slave latch 100 comprising a master latch 102 and a slave latch 104. FIG. 1b is a timing diagram of the clock signals for implementing the master-slave latch shown in FIG. 1a, with Clk 2 representing a "clock-bar" version of Clk 1. The master latch 102 and the slave latch 104 are clocked with two non-overlapping phases, such that the latch 102 serves as the master by receiving a data input $d_{in}$ in a first phase and then passes the data to the latch 104 in the second phase. The latch 102 includes a transmission gate 106 that is comprised of a P-type transistor 108 and an N-type transistor 110. When the Clk 1 transitions to "high," transistors 108 and 110 are both turned on, thereby allowing data, $d_{in}$, to be received via inverter 114 and passed to a storage node comprising inverters 116 and 118. Inverter 120 inverts the data from the storage node to its original state and provides the data to inverter 122 as an input to the slave latch 104.

The slave latch 104 comprises logic circuitry similar to that discussed above with respect to master latch 102. The transmission gate 124 is comprised of a P-type transistor 126 and an N-type transistor 128. When the Clk 2 transitions to "high," transistors 126 and 128 are both turned on, thereby allowing data from the inverter 122 to be passed through the transmission gate 124 to be passed to a storage node comprising inverters 132 and 134. Inverter 136 inverts the data from the storage node to its original state to generate a data output signal, $d_{out}$. As discussed above, the setup and launch delay through latches, such as the master-slave latch 100 shown in FIG. 1a, have become a significant portion of the cycle time, particularly in processor designs that utilize multi-gigahertz clock speeds.

Figure 2A:
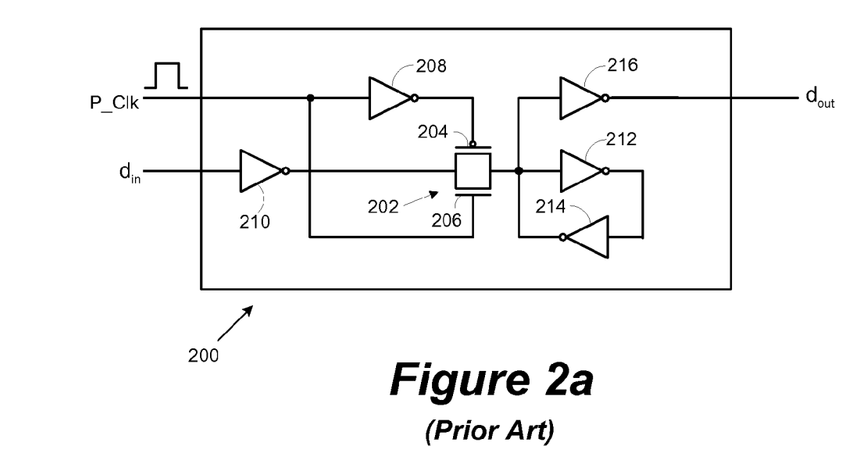
FIG. 2a is a schematic of the logic components of a prior art positive edge triggered latch.
Figure 2B:
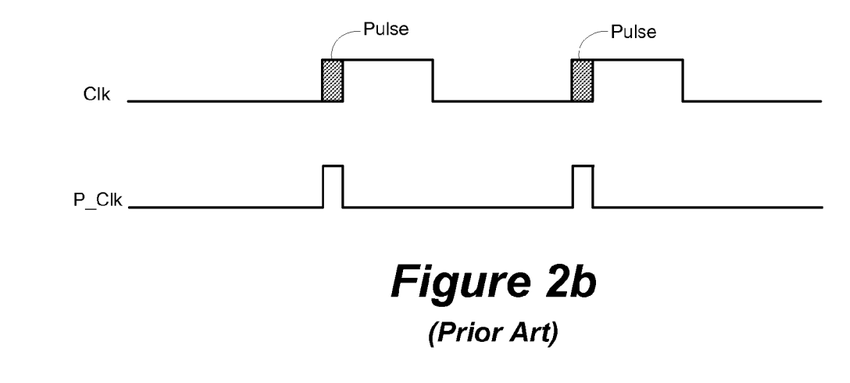

An alternative to a master-slave latch is the positive-edge-triggered pulse latch 200 shown in FIG. 2a. Many of the logic components of the pulse latch are similar to the components in either of the latch modules of the master-slave latch 100 discussed above. The pulse latch comprises a transmission gate 202 that is comprised of a P-type transistor 204 and an N-type transistor 206. When a positive-edged pulse is generated by the Clk, as shown in FIG. 2a, transistors 204 and 206 are turned "on" for a very brief time interval, thereby allowing data from the inverter 210 to be passed through the transmission gate 202 to be passed to a storage node comprising inverters 212 and 214. Inverter 216 inverts the data from the storage node to its original state to generate a data output signal, $d_{out}$.

Figure 3A:
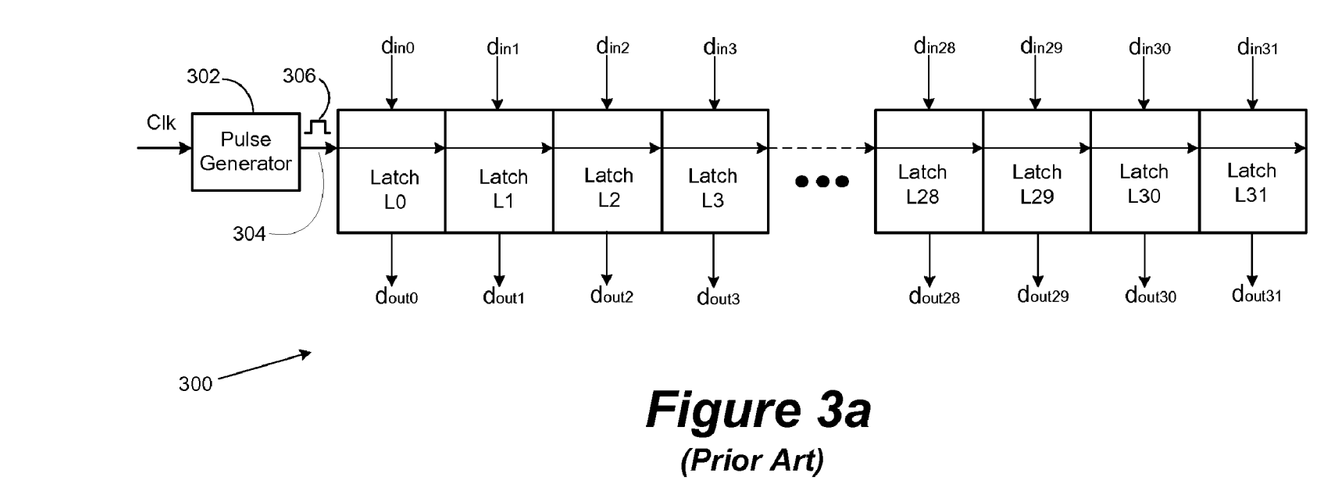
FIG. 3a is a diagram of a plurality of prior art latches configured to provide a datapath with external pulse generation.

FIG. 3a is a diagram of a plurality of positive-pulse-edge latches configured to provide a datapath. For discussion purposes, a 32-bit datapath is illustrated with a plurality of latches, $L_0$-$L_{31}$, that are operable to receive data inputs $d_{in0}$-$d_{in31}$ and to generate data outputs $d_{out0}$-$d_{out31}$ therefrom. A pulse generator 302 is operable to generate pulse 306 which provides the edge triggering for the latches $L_0$-$L_{31}$. The pulse signal is transmitted on a clock signal wire 304 using techniques known to those of skill in the art.

Figure 3B:
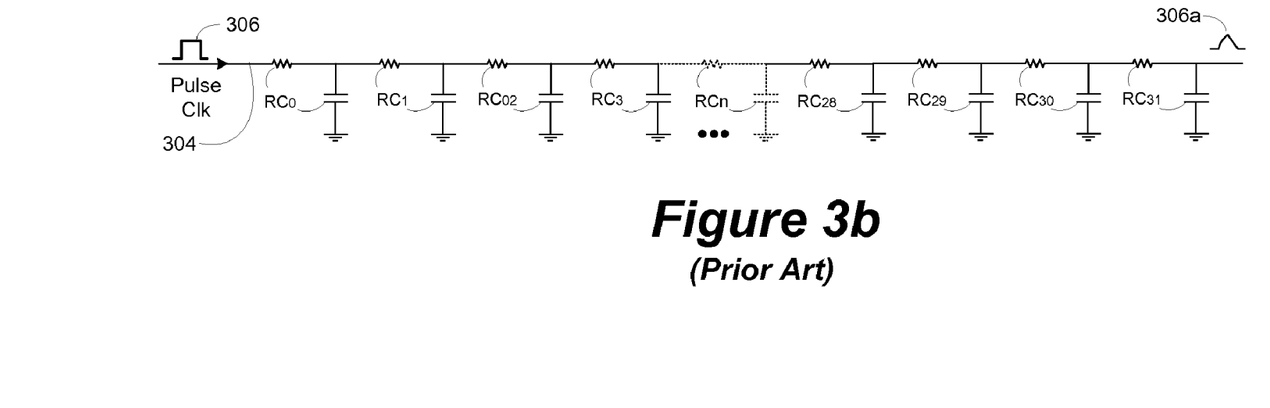

While the positive-edge-triggered pulse latches used in the datapath 300 have a minimal setup and delay time, the pulse generator circuitry is very sensitive to process variation, that can result in inconsistencies in the pulse width. In addition, the pulse propagation is dependent on the clock pin capacitance presented by each of the latches. Therefore, the pulse generation and propagation needs to be individually tuned depending on the size of the latches used in the datapath. Finally, the RC network of the clock signal wire 304 causes it to act as a low-pass filter that attenuates the pulse being propagated. This is shown generally in FIG. 3b wherein the RC network, $RC_0$-$RC_{31}$ of the portions of the conductor wire 304 in each of the latches creates a cumulative degradation in the quality of the pulse 306 entering the first latch to the degraded pulse 306a entering the last latch in the datapath.

Figure 4A:
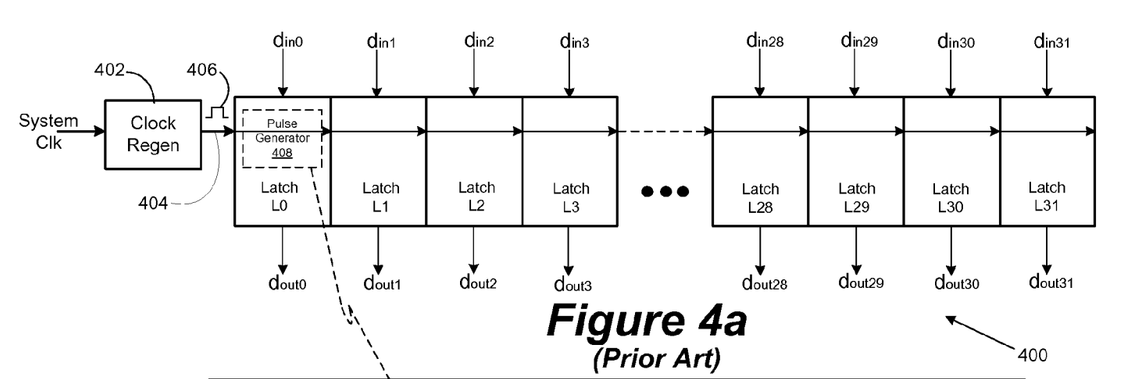
FIG. 4a is a diagram of a plurality of prior art latches configured to provide a datapath with internal pulse generation.
Figure 4B:
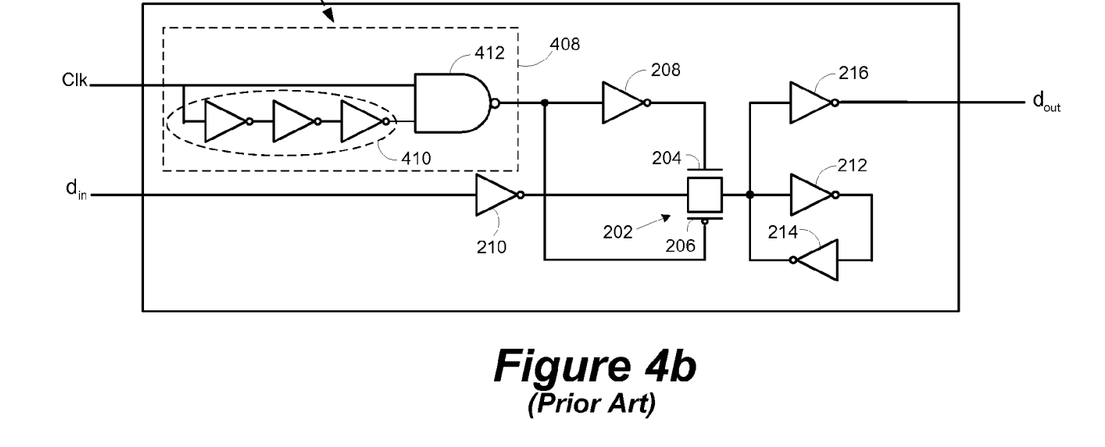

One of the solutions implemented in the prior art is the use of pulse generator circuitry within individual latches in a datapath. FIG. 4a is a diagram of a plurality of latches, $L_0$-$L_{31}$, that are operable to receive data inputs $d_{in0}$-$d_{in31}$ and to generate data outputs $d_{out0}$-$d_{out31}$ therefrom. A clock regeneration module 402 is operable to generate a clock signal 406 that is transmitted over a clock signal wire 404. Each of the latches in the datapath 400 comprises a pulse generator 408 that is operable to generate an individual pulse within each of the latches. The pulse generator 408, shown in FIG. 4b, comprises a plurality of inverters 410 that generate a delayed version of the Clk signal. A "NAND" gate 412 receives the Clk signal and the delayed version of the Clk signal and generates a pulse signal therefrom. The individual pulse generation circuit using the plurality of inverters provides the advantage of significantly reducing the propagation time for data through the data latches. However, the plurality of inverters 410 significantly adds to the number of transistors required for the individual latches in the datapath.

Figure 5A:
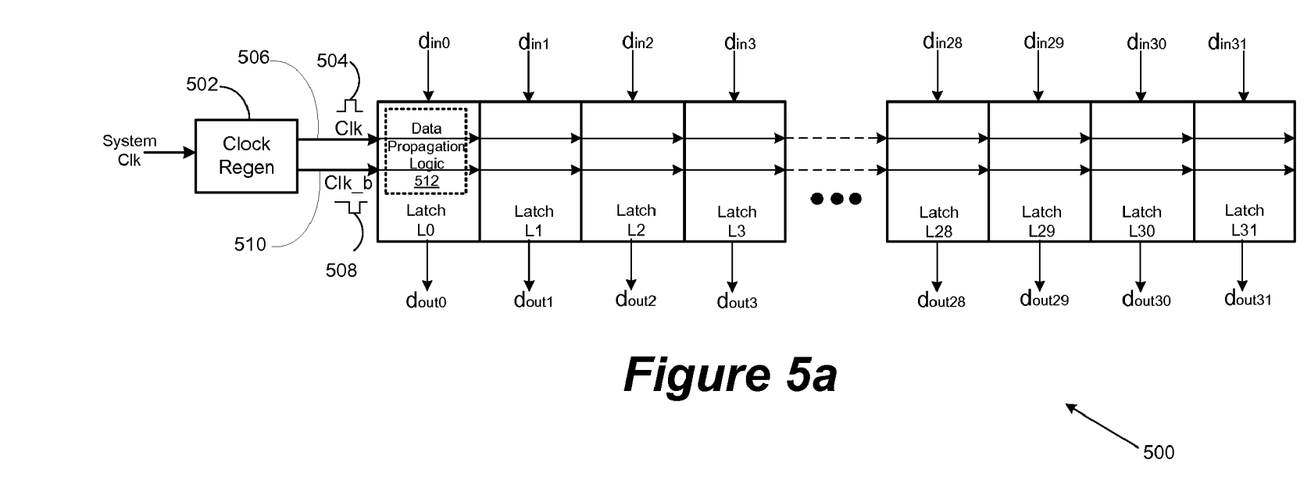
FIG. 5a is a diagram of an embodiment of the present invention wherein a plurality of latches are configured to provide a datapath with external clock regeneration circuitry.
Figure 5B:
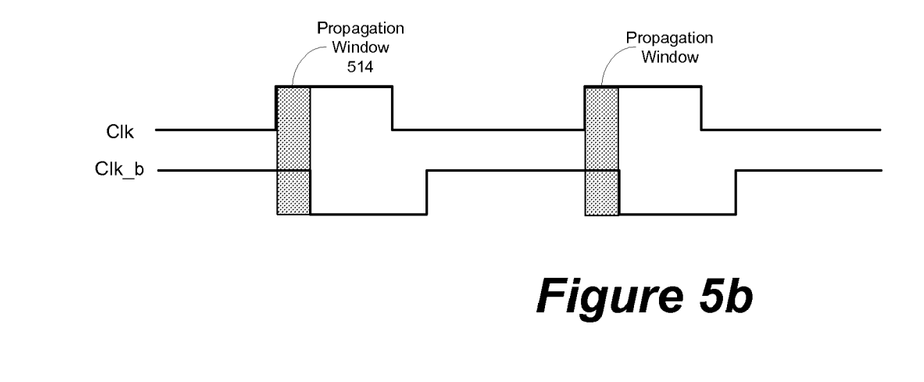

FIG. 5a is a diagram of an embodiment of the present invention wherein a datapath 500 comprises a plurality of latches, $L_0$-$L_{31}$, that are operable to receive data inputs $d_{in0}$-$d_{in31}$ and to generate data outputs $d_{out0}$-$d_{out31}$ therefrom. In this embodiment of the invention, clock regenerator circuitry 502 generates a Clk 504 transmitted over signal wire 506 and a Clk_b signal 508 that is transmitted over a signal wire 510. It should be noted that signal wire 506 and signal wire 510 of the embodiment illustrated in FIG. 5a are designed to have substantially similar resistance and capacitance characteristics. This ensures that signals Clk 504 and Clk_b 508 have substantially similar propagation characteristics from the clock regenerator circuitry 502 to each of the latches, $L_0$-$L_{31}$. The Clk_b signal 508 is a time-shifted and inverted version of the Clk signal 504 as illustrated in FIG. 5b. In the embodiment illustrated in FIG. 5b, the Clk_b signal is time-shifted with respect to the Clk signal by a predetermined time interval.

In the embodiment shown in FIG. 5a, each of the latches, $L_0$-$L_{31}$, comprises internal data propagation logic that is illustrated generally by the data propagation logic 512 in latch $L_0$. In the various embodiments of the invention, the two clock signal transmission wires 506 and 510 are used to transmit the Clk and Clk_b clock signals to the data propagation logic circuitry in each of the latches, $L_0$-$L_{31}$. The various embodiments of the data propagation logic described herein produce either an "implicit pulse" or an "explicit pulse" that enables a data propagation window 514, thereby providing the individual latches the advantages of a pulse latch without the problems associated with the pulse generators used in prior art pulse latches, as discussed hereinabove. The term "data propagation window" used herein is synonymous with the term "window of transparency" sometimes used by those of skill in the art to describe a brief period of time wherein data propagation logic allows data to propagate through a clocked storage element.

Figure 6A:
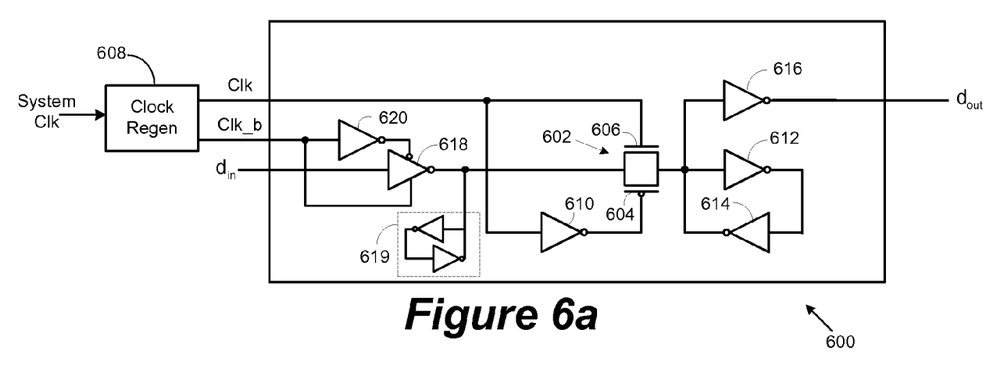
FIG. 6a is an illustration of an embodiment of the present invention wherein the clock signals of the clock regeneration circuitry are used to generate an implicit pulse data propagation window for an edge triggered latch.

FIG. 6a is an illustration of an embodiment of the present invention wherein an "implicit" pulse is used to generate a data propagation window to initiate the propagation of data through a latch 600. The latch 600 includes a transmission gate 602 that is comprised of a P-type transistor 604 and an N-type transistor 606. When the Clk signal generated by the clock regenerator 608 is "high," transistors 604 and 606 are turned "on," thereby allowing data to be passed through the transmission gate 602 to be passed to a storage node comprising inverters 612 and 614. The transmission gate 602 is connected to a tri-state inverter 618 that is operable to receive input data $d_{in}$. In an alternate embodiment, a keeper circuit 619 prevents the data node from floating and adds stability.

Clock regenerator 608 comprises clock regeneration logic, described in greater detail hereinbelow in the discussion of FIGS. 8a-d. The clock regenerator 608 is operable to receive a system clock signal and to generate first and second clock signals, designated as "Clk" and Clk_b." In this embodiment of the invention, the "Clk" signal is a regenerated version of the system clock and the "Clk_b" clock signal is a time-shifted and inverted version of the system clock. When Clk_b is "high," inverter 620 generates a "low" signal that causes the tri-state inverter 618 to turn "on" and pass the data, $d_{in}$, to the storage node inverters 612 and 614. Inverter 616 inverts the data from the storage node to its original state to generate a data output signal, $d_{out}$.

Figure 6B:
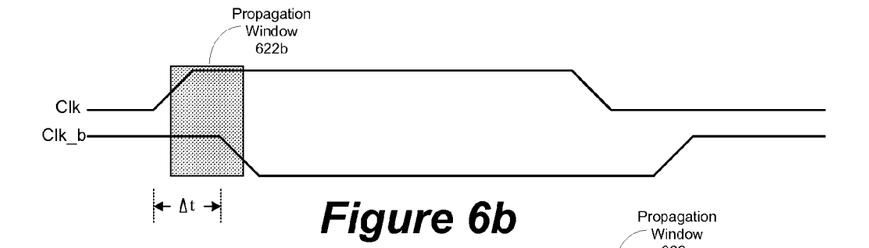
Figure 6C:
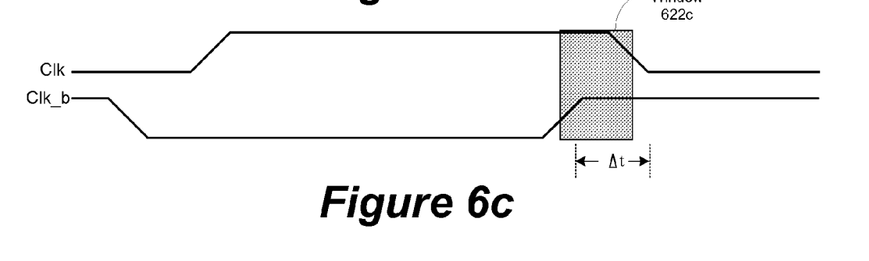

As will be understood by those of skill in the art, the logic circuitry configuration show in FIG. 6a uses the Clk signal and the time-shifted Clk_b signal that are provided as inputs to different logic gates to generate an "implicit" pulse that enables a data propagation window to initiate the propagation of data through the edge-triggered latch 600. FIGS. 6b and 6c are graphical illustrations of data propagation windows 622b and 622c, respectively, that are generated by the aforementioned logic circuitry of the latch 600 using the Clk and Clk_b signals. In an embodiment of the invention, the Clk_b signal is time-shifted by delaying it for a predetermined time increment, $\Delta t$, with respect to the Clk signal. In this embodiment, data is propagated through the transmission gate 602 during a data propagation window 622b during which both the Clk signal and the Clk_b signal are "high," as shown in FIG. 6b. Alternatively, the present invention can be implemented in an embodiment wherein the Clk signal is time-shifted by delaying it for by a predetermined time increment, $\Delta t$, with respect to the Clk_b signal. In this embodiment, data is propagated through the transmission gate 602 during a data propagation window 622c defined by a period of time that the time-shifted Clk signal and the Clk_b signal are both "high" as shown in FIG. 6c.

Figure 7A:
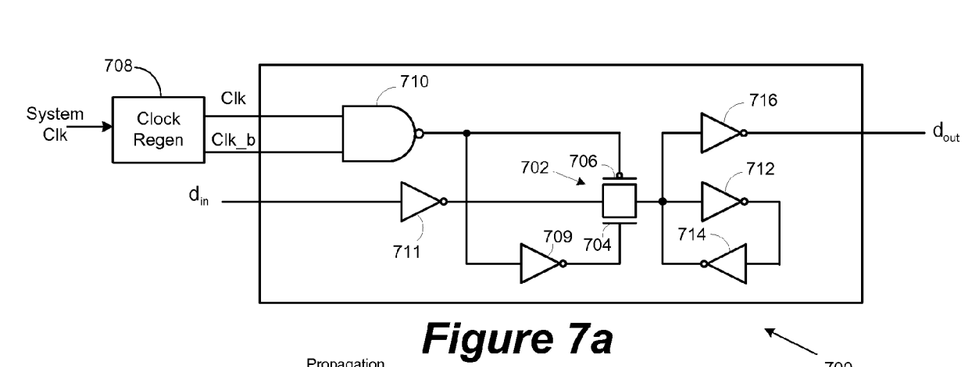
FIG. 7a is an illustration of another embodiment of the present invention wherein the clock signals of the clock regeneration circuitry are used to generate an explicit pulse data propagation window for an edge triggered latch.

FIG. 7a is an illustration of another embodiment of the present invention wherein an "explicit" pulse is used to generate a data propagation window to initiate the propagation of data through a latch 700. The latch 700 comprises logic components similar to those discussed above with regard to the latch of FIG. 6a. The latch 700 includes a transmission gate 702 that is comprised of an N-type transistor 704 and a P-type transistor 706. When the Clk and Clk_b signals generated by the clock regenerator 708 are "high," the NAND gate 708 generates a "low" signal and, therefore, transistors 704 and 706 are turned "on," thereby allowing data to be passed through the transmission gate 702. The transmission gate 702 is connected to an inverter 711 that is operable to receive an inverted representation of input data $d_{in}$. When the transmission gate 702 is "on," the data $d_{in}$ is passed to the storage node inverters 712 and 714. Inverter 716 inverts the data from the storage node to its original state to generate a data output signal, $d_{out}$.

Clock regenerator 708 is operable to generate first and second clock signals designated as "Clk" and Clk_b." The "Clk" signal is a regenerated version of the system clock and the "Clk_b" clock signal is a time-shifted and inverted version of the system clock. As will be understood by those of skill in the art, the logic circuitry configuration show in FIG. 7a provides the Clk and Clk_b signals as inputs to a single gate, i.e., NAND gate 710, to generate an "explicit" pulse that provides a data propagation window to initiate the propagation of data through an edge triggered latch 700.

Figure 7B:
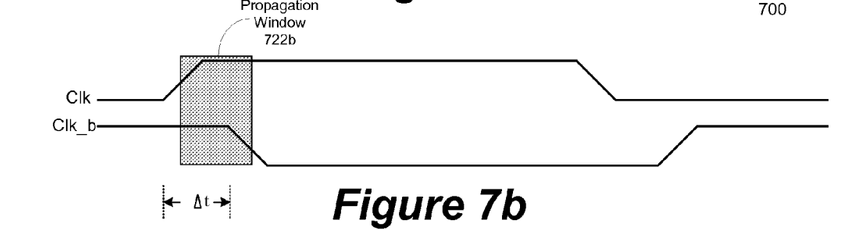
Figure 7C:
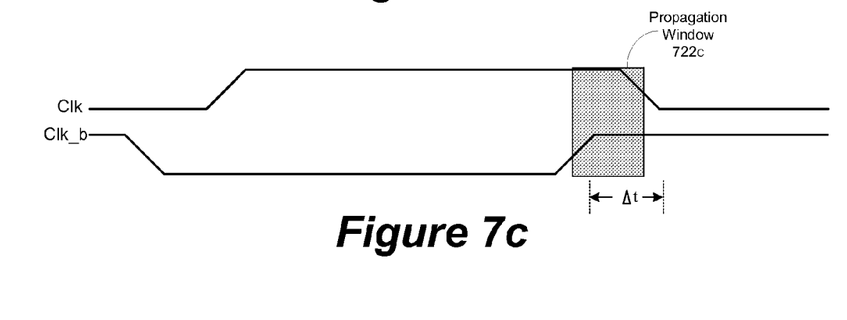

FIGS. 7b and 7c are graphical illustrations of data propagation windows 722b and 722c that are generated by the aforementioned logic circuitry of the latch 700 shown in FIG. 7a using the Clk and Clk_b signals. In the embodiment shown in FIG. 7b, the Clk_b signal is time-shifted by a predetermined time increment, $\Delta t$, with respect to the Clk signal, thereby defining a data propagation window 722b during which both the Clk signal and the Clk_b signal are "high." Alternatively, the present invention can be implemented in an embodiment wherein the Clk signal is time-shifted by delaying it by a predetermined time increment, $\Delta t$, with respect to the Clk_b signal. In this embodiment, data is propagated through the transmission gate 702 during a data propagation window 722c defined by a period of time that the time-shifted Clk signal and the Clk_b signal are both "high" as shown in FIG. 7c.

Figure 8A:
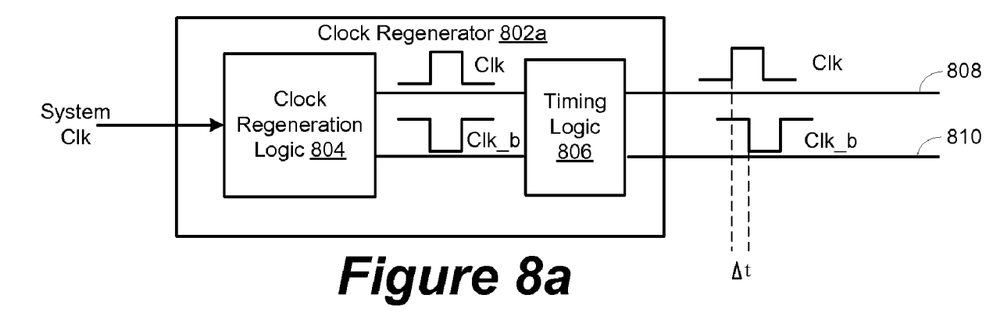
FIGS. 8a-d are illustrations of various embodiments of clock regeneration circuitry for generating the clock signals used in various embodiments of the invention.
Figure 8B:
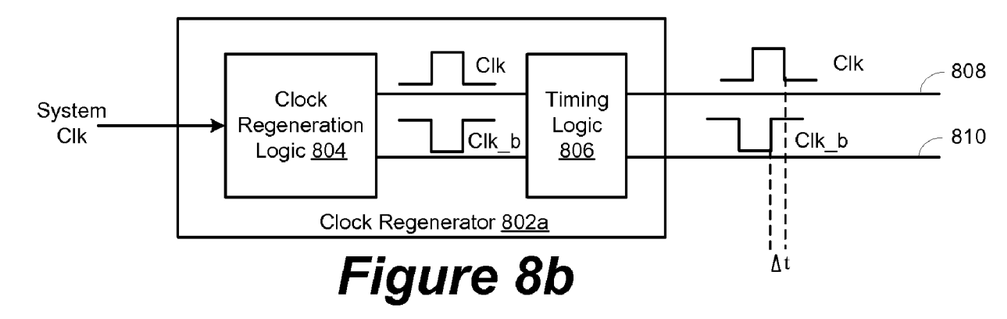
Figure 8C:
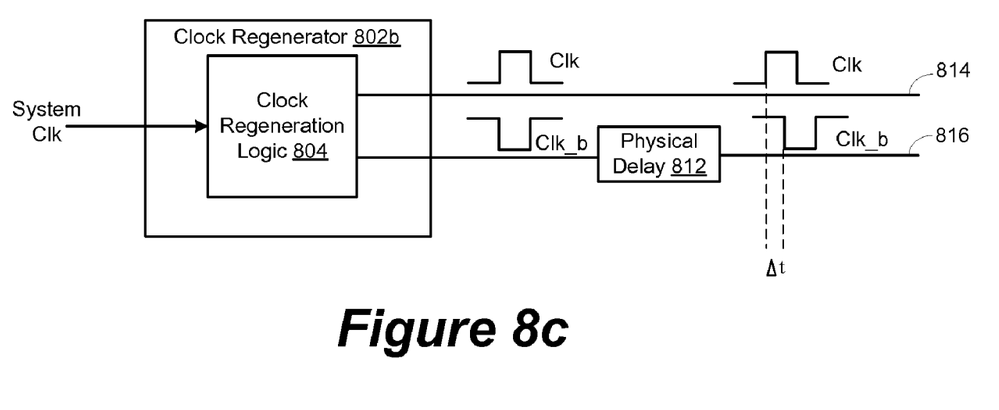

FIGS. 8a-c show embodiments of the circuitry used in the present invention to generate the Clk signal, the Clk_b signal and the time-shifted versions of these signals. In the embodiments illustrated in FIGS. 8a and 8b, the clock regenerator 802a comprises clock regeneration logic 804 and timing logic 806. The clock regeneration logic 804 is operable to receive a system Clk signal and to generate a Clk signal and a Clk_b signal. As will be understood by those of skill in the art, the timing logic 806 is operable to control the timing relationship between the Clk and the Clk_b signals so that either of these signals can be advanced or delayed with respect to the other.

In the embodiment shown in FIG. 8a, the timing of the Clk and the Clk_b signals has been modified by the timing logic 806 so that the rising edge of the Clk signal precedes the falling edge of the corresponding Clk_b signal by a predetermined time increment, $\Delta t$, thereby providing the timing relationship shown in FIGS. 6b and 7b. As discussed above, this relationship can be obtained by using the timing logic 806 to relatively advance the Clk signal or delay the corresponding Clk_b signal by the time increment $\Delta t$. In the embodiment shown in FIG. 8b, the timing of the Clk and the Clk_b signals has been modified by the timing logic 806 so that the rising edge of the Clk_b signal precedes the falling edge of the corresponding Clk signal by a predetermined time increment, Δt, thereby providing the timing relationship shown in FIGS. 6c and 7c. This relationship can be obtained by using the timing logic 806 to advance the Clk_b signal or delay the corresponding Clk signal by the time increment Δt. In the embodiments shown in FIGS. 8a and 8b, the Clk and Clk_b signals are propagated using clock signal lines 808 and 810, respectively, that have identical resistivity and capacitance characteristics, thereby ensuring that the timing relationship of the Clk and Clk_b signals are maintained as these signals propagate across the latches in the datapath.

Figure 8D:
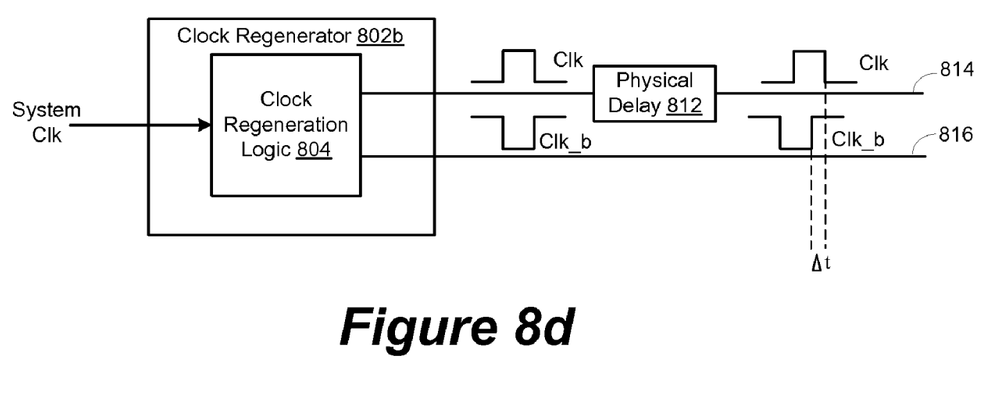

FIGS. 8c and 8d show alternate embodiments of the clock generator 802b wherein the time-shifted versions of the Clk and Clk_b signals are generated using a physical delay element 812. The physical delay element 812 may comprise a discrete circuit component that is operable to provide a predetermined time delay. Alternatively, a portion of the clock signal lines 814 and 816 can be modified, using techniques known in the art, to provide appropriate RC characteristics to cause the predetermined time delay. In the embodiment shown in FIG. 8c, the physical delay element 812 is used to provide a delayed version of the Clk_b signal to provide the timing relationship shown in FIGS. 6b and 7b. In the embodiment shown in FIG. 8d, the physical delay element 812 receives the Clk signal rather than the Clk_b signal to provide the timing relationships shown in FIGS. 6c and 7c.

As will be appreciated by those of skill in the art, a system and method has been disclosed that allows clocked storage elements in a datapath to propagate data with minimal latency. Embodiments of the system are broadly comprised of: a plurality of clocked data storage elements operable to receive input data and to generate output data therefrom; a first clock signal, a second clock signal, and data propagation logic circuitry operable to use the first and second clock signals to enable a data propagation window to cause data to propagate through the clocked data storage elements. In some embodiments, the second clock signal is an inverted version of the first clock signal that is time-shifted by a predetermined time interval with respect to the first clock signal.

In various embodiments, the plurality of clocked data storage elements are configured as edge-triggered latches. In some embodiments of the system, each individual clocked data storage element in the plurality of clocked data storage elements comprises data propagation logic circuitry. Various embodiments of the data propagation logic circuitry can be configured to generate either an "explicit pulse" or an "implicit pulse" to enable a data propagation window. In an embodiment, the data propagation logic circuitry for generating an explicit pulse comprises a single gate that receives said first and second clock signals. In another embodiment, the data propagation logic circuitry for generating an implicit pulse comprises first and second logic gates for receiving said first and second clock signals, respectively.

In some embodiments, the first and second clock signals are transmitted on signal lines having identical RC characteristics. In other embodiments, the first and second clock signals are transmitted on signal lines having different RC signal characteristics, wherein the RC characteristics of one of the signal lines causes a predetermined time delay for the clock signal carried thereon.

Embodiments of the invention also provide a method for propagating data in a datapath. The method is broadly comprised of: providing input data to a plurality of clocked data storage elements operable to generate output data from the input data; generating first and second clock signals; providing the first and second clock signals to data propagation logic circuitry in the clocked data storage elements; and using the first and second clock signals to enable data propagation windows to propagate data through the clocked data storage elements. In some embodiments, the second clock signal is an inverted version of the first clock signal that is time-shifted by a predetermined time interval with respect to the first clock signal.

In various embodiments of the method, the plurality of clocked data storage elements are configured as edge-triggered latches. In some embodiments of the method, each individual clocked data storage element in the plurality of clocked data storage elements comprises data propagation logic circuitry. In various embodiments of the method, data propagation logic circuitry can be configured to generate either an "explicit pulse" or an "implicit pulse" to enable a data propagation window. In an embodiment of the method, the data propagation logic circuitry for generating an explicit pulse comprises a single gate that receives said first and second clock signals. In another embodiment of the method, the data propagation logic circuitry for generating an implicit pulse comprises first and second logic gates for receiving said first and second clock signals, respectively.

In some embodiments of the method, the first and second clock signals are transmitted on signal lines having identical RC characteristics. In other embodiments, the first and second clock signals are transmitted on signal lines having different RC signal characteristics, wherein the RC characteristics of one of the signal lines causes a predetermined time delay for the clock signal carried thereon.

Setup and launch delay is minimized using embodiments of the system and method described herein. Furthermore, the various embodiments may significantly reduce the number of transistors used to implement the individual latches in the datapath. Also, some embodiments may have the advantage of reducing clock loading in the various components in the datapath.

Although the described exemplary embodiments disclosed herein are directed to various examples of a system and method for using clock signals to enable a data propagation window to propagate data through a datapath, the present invention is not necessarily limited to the example embodiments. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. Examples of this include the addition of transistors that are used for testing or scanning data into and out of the latch.

What is claimed is:

1. A system for propagating data in a datapath, comprising:
   a plurality of clocked data storage elements operable to receive input data and to generate output data therefrom;
   clock regeneration circuitry, external to said plurality of clocked data storage elements, said clock regeneration circuitry operable to generate first and second clock signals, wherein said second clock signal comprises an inverted version of said first clock signal, said second clock signal being time-shifted by a predetermined time interval with respect to said first clock signal;
   first and second data transmission elements in individual clocked data storage elements in said plurality of clocked data storage elements, each of said first and second data transmission elements having a first state wherein propagation of data is enabled and a second state wherein propagation of data is not enabled; and
   data propagation logic circuitry operable to use said first and second clock signals to simultaneously maintain said first and second data transmission elements in said first state for a predetermined period of time to cause data to propagate through said clocked data storage elements.

2. The system of claim 1, wherein said plurality of clocked data storage elements are configured as edge-triggered latches.

3. The system of claim 1, wherein said first and second clock signals are transmitted on signal lines having identical RC characteristics.

4. The system of claim 1, wherein said first and second clock signals are transmitted on signal lines having different signal delay characteristics and wherein the signal delay characteristics of one of said signal lines causes a predetermined time delay for the clock signal carried thereon.

5. A method of providing a propagating datapath, comprising:
   providing input data to a plurality of clocked data storage elements operable to generate output data from said input data;
   using clock regeneration circuitry to generate first and second clock signals, wherein said second clock signal comprises an inverted version of said first clock signal, said second clock signal being time-shifted by a predetermined time interval with respect to said first clock signal and wherein said clock regeneration circuitry is external to said individual clocked storage elements and;
   using first and second data transmission elements in individual clocked data storage elements in said plurality of clocked data storage elements to propagate data through said individual clocked data storage elements, each of said first and second data transmission elements having a first state wherein propagation of data is enabled and a second state wherein propagation of data is not enabled;
   providing said first and second clock signals to data propagation logic circuitry in said clocked data storage elements; and
   using said first and second clock signals to simultaneously maintain said first and second data transmission elements in said first state for a predetermined period of time to propagate data through said clocked data storage elements.

6. The method of claim 5, wherein said plurality of clocked data storage elements are configured as edge-triggered latches.

7. The method of claim 5, wherein said first and second clock signals are transmitted on signal lines having identical RC characteristics.

8. The method of claim 5, wherein said first and second clock signals are transmitted on signal lines having different RC signal delay characteristics and wherein the signal delay characteristics of one of said signal lines causes a predetermined time delay for the clock signal carried thereon.

* * * * *